US010991767B2

(12) United States Patent
Xin et al.

(10) Patent No.: US 10,991,767 B2
(45) Date of Patent: Apr. 27, 2021

(54) DISPLAY PANEL AND DISPLAY APPARATUS

(71) Applicant: Shanghai Tianma AM-OLED Co., Ltd., Shanghai (CN)

(72) Inventors: Yu Xin, Shanghai (CN); Kang Yang, Shanghai (CN); Lijing Han, Shanghai (CN); Xian Chen, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/420,551

(22) Filed: May 23, 2019

(65) Prior Publication Data

US 2020/0227488 A1 Jul. 16, 2020

(30) Foreign Application Priority Data

Jan. 15, 2019 (CN) .......................... 201910036533.8

(51) Int. Cl.
*H01L 27/32* (2006.01)
(52) U.S. Cl.
CPC ...... *H01L 27/3216* (2013.01); *H01L 27/3262* (2013.01)
(58) Field of Classification Search
CPC .................................................. H01L 27/3216
See application file for complete search history.

(56) References Cited

U.S. PATENT DOCUMENTS

| 2017/0213873 | A1* | 7/2017 | Bok | .................... | H01L 51/5206 |
| 2018/0365471 | A1* | 12/2018 | Xin | ........................ | H01L 27/326 |
| 2019/0326366 | A1* | 10/2019 | Fan | ...................... | H01L 27/3218 |
| 2020/0225396 | A1* | 7/2020 | Chen | ................... | H01L 51/5293 |

FOREIGN PATENT DOCUMENTS

| CN | 107004391 A | 8/2017 |
| CN | 107025875 A | 8/2017 |
| CN | 107275359 A | 10/2017 |
| CN | 107633802 A | 1/2018 |
| CN | 108269502 A | 7/2018 |

OTHER PUBLICATIONS

Chinese Office Action dated Jul. 13, 2020 for corresponding Chinese Application No. 201910036533.8.

* cited by examiner

*Primary Examiner* — Moazzam Hossain
(74) *Attorney, Agent, or Firm* — Tarolli, Sundheim, Covell & Tummino LLP

(57) ABSTRACT

The present disclosure provides a display panel having a first display region and second display region, and a display apparatus. The display panel includes a sub-pixel array that includes a plurality of sub-pixels in an array and distributed in the first display region and the second display region. A non-light-emitting region in the second display region has a greater light transmittance than a non-light-emitting region in the first display region, a distribution density of sub-pixels of the plurality of sub-pixels in the second display region is smaller than a distribution density of sub-pixels of the plurality of sub-pixels in the first display region, and among sub-pixels emitting a same color, a light-emitting area of a sub-pixel in the second display region is larger than a light-emitting area of a sub-pixel in the first display region.

18 Claims, 8 Drawing Sheets

DISPLAY PANEL AND DISPLAY APPARATUS

CROSS-REFERENCE TO RELATED APPLICATIONS

The present disclosure claims priority to Chinese Patent Application No. 201910036533.8, filed on Jan. 15, 2019, the content of which is incorporated herein by reference in its entirety.

TECHNICAL FIELD

The present disclosure relates to the field of display technologies, and in particular, to a display panel and a display apparatus including the display panel.

BACKGROUND

With the continuous development of display technologies, consumers' requirements on display panels are continuously increasing, and various kinds of display panel have emerged and have been rapidly developed, such as liquid crystal display panels, organic light-emitting display panels, and the like. On basis of that, new display technologies such as 3D display, touch display technologies, curved display, ultra-high resolution display and anti-spy display, continue to be developed to meet the needs of consumers.

In addition, in recent years, more functions have been integrated into the display panels, such as fingerprint recognition, light touch, face recognition, iris recognition, etc. It is necessary for the functions such as fingerprint recognition and face recognition that light should transmit through the display panel and irradiate onto a sensing device mounted at a backlight surface of the display panel, which requires the display panel to have a sufficiently high light transmittance. However, in the current display panels, on the one hand, with an increasing resolution, the sub-pixels are distributed with an increasing density, and the number of pixel circuits is also increased correspondingly. On the other hand, transistors in the pixel circuits are formed by a metal layer, which makes the transmitting of light through the display panel harder, thereby reducing the transmittance of the display panel. Therefore, an urgent technical problem to be solved is how to further improve the light transmittance of the display panel under the premise of a higher resolution of the display panel, for achieving accurate fingerprint recognition and face recognition functions.

SUMMARY

In view of above, the present disclosure provides a display panel and a display apparatus, for improving the light transmittance of the display panel under the premise of a high resolution of the display panel, and thus realizing accurate fingerprint recognition and face recognition functions.

In one aspect, the present disclosure provides a display panel, having a first display region and a second display region. The display panel includes a sub-pixel array. The sub-pixel array includes a plurality of sub-pixels arranged in an array. The plurality of sub-pixels is distributed in the first display region and the second display region. A non-light-emitting region in the second display region has a greater light transmittance than a non-light-emitting region in the first display region. A distribution density of sub-pixels of the plurality of sub-pixels in the second display region is smaller than a distribution density of sub-pixels of the plurality of sub-pixels in the first display region. Among sub-pixels emitting a same color of the plurality of sub-pixels in the first display region and the second display region, a light-emitting area of a sub-pixel in the second display region is larger than a light-emitting area of a sub-pixel in the first display region.

In another aspect, the present disclosure provides a display apparatus including the above-mentioned display panel.

DESCRIPTION OF EMBODIMENTS

In order to explain the above described purposes, features and advantages of the present disclosure, the present disclosure will be elaborated below in combination of drawings and embodiments.

It should be understood that specific details set forth in the following description aim to facilitate the understanding of the present disclosure. The present disclosure can be implemented in a variety of manners different from those described herein, and those skilled in the art can make similar development without departing from the scope of the present disclosure. Therefore, the present disclosure is not limited to the specific embodiments disclosed below.

Figure 1:
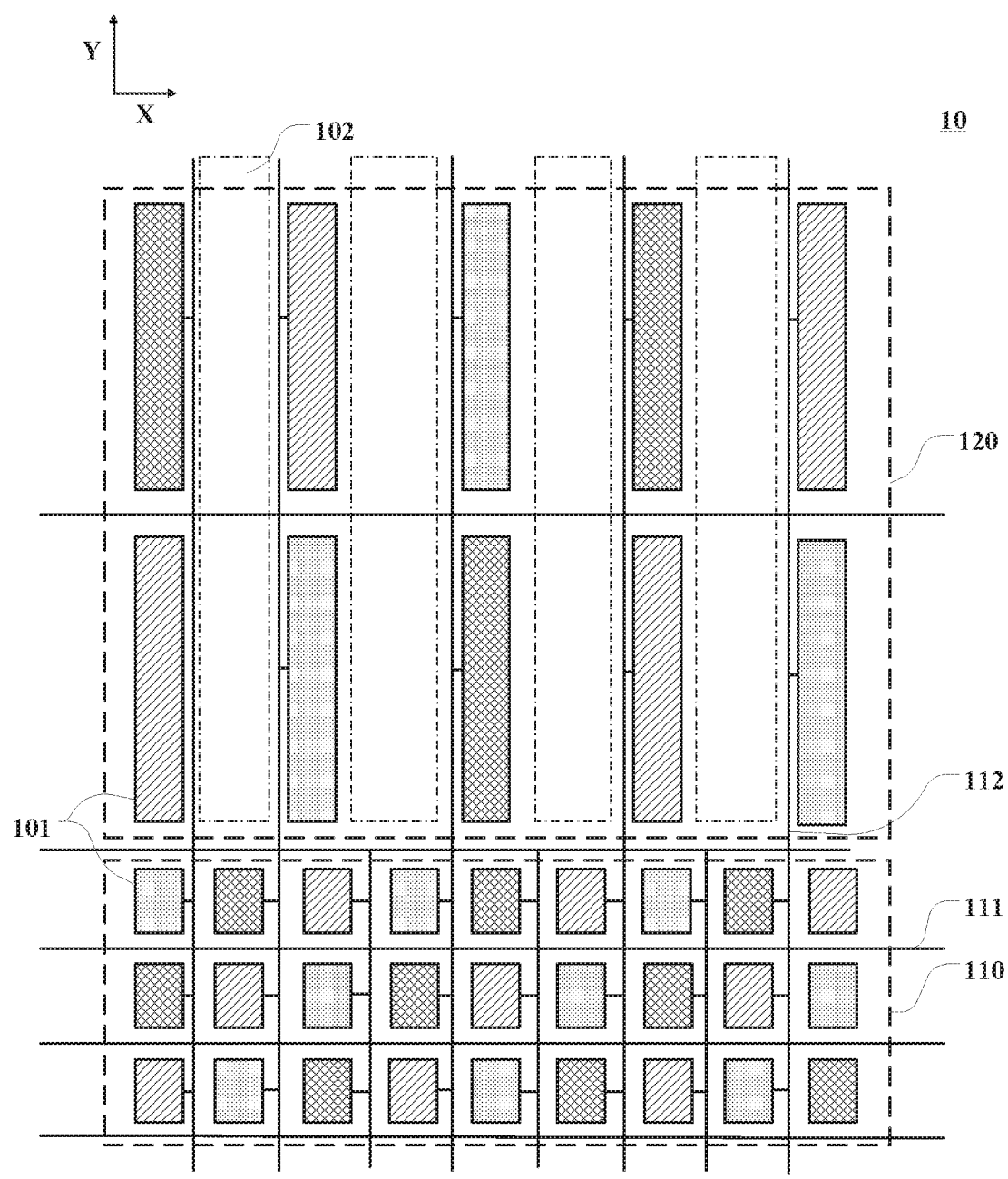
FIG. 1 is a schematic structural diagram of a display panel according to an embodiment of the present disclosure.

FIG. 1 is a schematic structural diagram of a display panel according to an embodiment of the present disclosure. As shown in FIG. 1, the display panel 10 includes a sub-pixel array, the sub-pixel array includes a plurality of sub-pixels 101 arranged in an array, and the plurality of sub-pixels 101 is distributed in a first display region 110 and a second display region 120 of the display panel 10. A non-light-emitting region of the second display region 120 has a greater light transmittance than a non-light-emitting region of the first display region 110. A distribution density of sub-pixels 101 in the second display region 120 is smaller than a distribution density of sub-pixels 101 in the first display region 110, and among sub-pixels having a same illumination color of the plurality of sub-pixels in the first display region 110 and the second display region 120, a light-emitting area of a sub-pixel in the second display region 120 is larger than a light-emitting area of a sub-pixel in the first display region 110.

It should be noted that the display panel 10 provided in this embodiment can be an organic light-emitting display panel including an anode, a cathode, and an organic light-emitting layer disposed between the anode and the cathode. By applying a voltage between the anode and the cathode, carriers can be excited to migrate and act on the organic light-emitting layer, such that the organic light-emitting layer emits light. In variations of the present embodiment, the display panel 10 can be other types of display panel, such as a quantum dot light-emitting display panel, a nano crystal light-emitting display panel, or the like, which will not be further described in detail herein.

In addition, as shown in FIG. 1, since the distribution density of sub-pixels in the second display region 120 is relatively lower, a distance between centers of two adjacent sub-pixels in this region is relatively large, and thus the region between the sub-pixels is a high-transmittance region 102. Generally, a face recognition device or a fingerprint recognition device can be disposed in the place corresponding to the high-transmission region 102, so that the face recognition device or the fingerprint recognition device can sufficiently receive an optical signal, thereby realizing an accurate unlocking function.

In the display panel and display apparatus provided by the present embodiment, as described above, include the first display region 110 and the second display region 120. The light transmittance of the second display region 120 is greater than that of the first display region 110, the distribution density of the sub-pixels in the second display region 120 is smaller than the distribution density of the sub-pixels in the first display region 110, and among sub-pixels having a same illumination color in the first display region and the second display region, a sub-pixel in the second display region 120 has a larger light-emitting area than a sub-pixel in the first display region 110. With such configuration, the light transmittance in the second display region 120 is increased by reducing the distribution density of the sub-pixels in the second display region 120. However, the reduced distribution density of the sub-pixels in the second display region 120 will result in a decrease in an aperture ratio of the sub-pixels in the second display region 120. Therefore, by increasing the light-emitting area of each sub-pixel in the second display region 120, the first display region 110 and the second display region 120 tend to have an identical aperture ratio, thereby ensuring brightness uniformity of the display panel.

According to an embodiment, the non-light-emitting region in the first display region 110 has a light transmittance of T1, and the non-light-emitting region in the second display region 120 has a light transmittance of T2, where T1 and T2 satisfy: $3 \leq T2/T1 \leq 50$. Since the region generally used for setting a device such as the fingerprint or face recognition device is only a partial region of the display panel, in order to ensure normal display of the display panel, only a partial region (the second display region 102) of the display panel is set to be a high-transmittance region, while other regions can still be normal display regions, and when the light transmittance of the high-transmittance region satisfies the above ratio, the light can be sufficiently transmitted through the high-transmittance region, thereby ensuring accurate fingerprint or face recognition function of the display panel.

As shown in FIG. 1, in an embodiment, the display panel 10 includes gate signal lines 111 extending along a first direction X and data lines 112 extending along a second direction Y. The first direction X intersects with the second direction Y. The gate signal lines 111 are connected to a gate driving circuit to provide gate driving signals for the sub-pixels 101, and the data lines 112 are connected to a driving chip to provide data signals for the sub-pixels 101. In particular, in this embodiment, the first direction X is perpendicular to the second direction Y.

Figure 2:
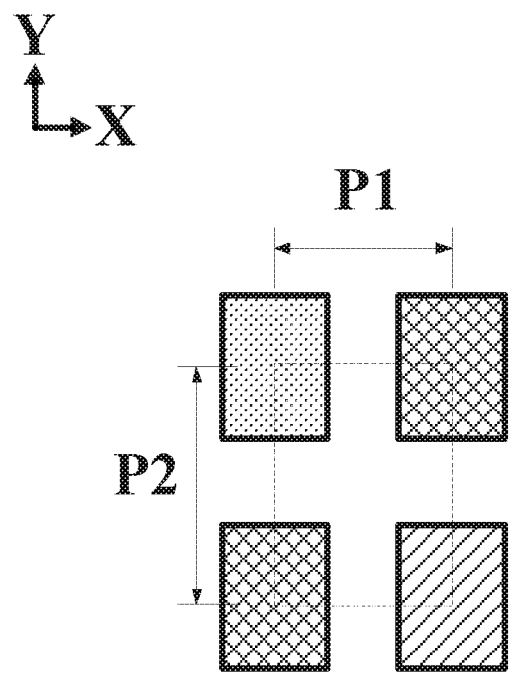
FIG. 2 is a schematic diagram showing a sub-pixel aperture ratio according to an embodiment of the present disclosure.

Further, in the present embodiment, among sub-pixels emitting light having the same color, a width in the first direction X of the sub-pixel in the second display region 120 is R1 times a width in the first direction X of the sub-pixel in the first display region 110, and a width in the second direction Y of the sub-pixel in the second display region 120 is R2 times a width in the second direction Y of the sub-pixel in the first display region 110. A ratio of a center-to-center distance between two adjacent sub-pixels in the first direction X in the second display region 120 to a center-to-center distance between two adjacent sub-pixels in the first direction X in the first display region 110 is R3, and a ratio of a center-to-center distance between two adjacent sub-pixels in second direction Y in the second display region 120 to a center-to-center distance spacing between two adjacent sub-pixels in the second direction Y in the first display region 110 is R4, where $0.8 \leq (R1 \times R2)/(R3 \times R4) \leq 1.2$. FIG. 2 is a schematic diagram showing a sub-pixel aperture ratio according to an embodiment of the present disclosure. Referring to FIG. 2, a center-to-center distance between adjacent sub-pixels in the first direction X is P1, a center-to-center distance between two adjacent sub-pixels in the second direction Y is P2, and thus an area of the dotted region is $S=P1 \times P2$. The sub-pixel aperture ratio is a ratio of a total area of sub-pixel regions within the dotted region to the area of the dotted region. As described above, for example, the width in the first direction of the sub-pixels in the second display region 120 is R1 times the width in the first direction of the sub-pixels in the first display region 110, the width in the second direction of the sub-pixels in the second display region 120 is R2 times the width in the second direction of the sub-pixels in the first display region 110, and thus the area of the sub-pixel regions in the dotted region in the second display region 120 is $(R1 \times R2)$ times the area of the sub-pixel regions in the dotted region in the first display region 110. Further, since P1 in the second display region 120 is R3 times P1 in the first display region 110, and P2 in the second display region 120 is R4 times P2 in the first display region 110, the area of the dotted region in the second display region 120 is $(R3 \times R4)$ times the area of the dotted region in the first display region 110, and in this regard, the aperture ratio of the second display region 120 is $[(R1 \times R2)/(R3 \times R4)]$ times the aperture ratio of the first display region 110. Therefore, if the first display region 110 and the second display region 120 tend to have an identical aperture ratio, the value of $[(R1 \times R2)/(R3 \times R4)]$ should approach 1 or be equal to 1. In an embodiment, a range is set, $0.8 \leq (R1 \times R2)/(R3 \times R4) \leq 1.2$. Within this range, the aperture ratios the first display region 110 and the second display region 120 tend to be uniform, so that the overall brightness of the display panel is uniform.

The above embodiments are described based on a situation where the area magnification of the second display region 120 and the first display region 110 is identical for sub-pixels of all colors. Alternatively, in some other embodiments, the sub-pixels have different area magnifications according to different colors.

In an embodiment, the display panel 10 at least includes red sub-pixels, green sub-pixels, and blue sub-pixels. A ratio of a light-emitting area of the green sub-pixels in the second display region 120 to a light-emitting area of the green sub-pixels in the first display region 110 is smaller than a ratio of a light-emitting area of the red sub-pixels in the second display region 120 to a light-emitting area of the red sub-pixels in the first display region 110 and/or a ratio of a light-emitting area of the blue sub-pixels in the second display region 120 to a light-emitting area of the blue sub-pixels in the first display region 110. The reason is in that, the human eyes have the highest specific visual perception to the green sub-pixels, and thus the light loss caused by appropriate reduction of the light-emitting area of the green sub-pixels is smaller than the red light and blue light. Generally, in the display panel, the green sub-pixel can meet the display requirement with a relatively small light-emitting area. Therefore, in the present embodiment, in order to further increase the light transmittance of the second display region 120, the light-emitting area of the green sub-pixels in the second display region 120 is designed to be smaller, which can still ensure the brightness of the second display region 120.

Figure 3:
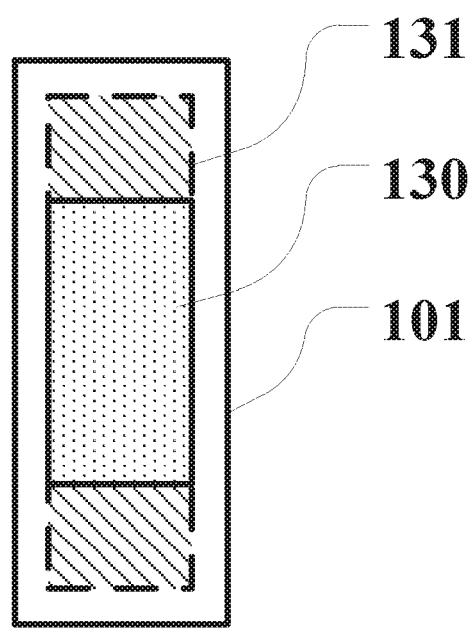
FIG. 3 is a schematic structural diagram of a sub-pixel according to an embodiment of the present disclosure.

FIG. 3 is a schematic structural diagram of a sub-pixel according to an embodiment of the present disclosure. Referring to FIG. 3, the sub-pixel 101 includes an anode 130 and a pixel circuit 131. In the second display region 120, the anode 130 and the pixel circuit 131 extend in a same direction, while the anode 130 and the pixel circuit 131 overlap each other in a direction perpendicular to a surface of the display panel 10. In such design, in which the anode 130 and the pixel circuit 131 extend in the same direction and the anode 130 and the pixel circuit 131 overlap each other, an overlapping degree between the anode 130 and the pixel circuit 131 can be as high as possible. Since the pixel circuit is a main structure that affects the light transmittance of the non-light-emitting area, if the pixel circuit 131 is covered as much as possible by the anode 130, the area of the part of the pixel circuit 131 extending to the non-light-emitting area can be reduced, thereby increasing the light transmittance of the non-light-emitting area. It should be noted that the said light-emitting area of the sub-pixel 101 tend to be equal to or even is equal to the area of the anode 130. As light emitted by the light-emitting layer is reflected by the anode 130 and exits from a light-emitting side, the light-emitting area of the pixel corresponds to the area of the anode. In addition, it should be noted that the pixel circuit 131 shown in the figure is merely illustrative, and the pixel circuit 131 usually includes a plurality of transistors and a capacitor, such as a 6T1C pixel circuit including six transistors and one capacitor. The specific structure of the pixel circuit is not described in detail herein.

In a further embodiment, in the second display region 120, the anode 130 completely covers the pixel circuit 131 alone at least one direction of the first direction X or the second direction Y For example, when the anode 130 completely covers the pixel circuit 131 in the first direction X, no metal film layer of the pixel circuit is provided between two adjacent sub-pixels in the first direction X, so that the region between adjacent sub-pixels has a relatively high light transmittance. In particular, the anode 130 can completely cover the pixel circuit 131 in both the first direction X and the second direction Y such that both the region between adjacent sub-pixels in the first direction X and the region between adjacent sub-pixels in the second direction Y have a relatively high light transmittance.

In addition, in an embodiment, among sub-pixels of the same color in the first display region 110 and the second display region 120, a width-to-length ratio of a driving transistor in the pixel circuit of the sub-pixel in the second display region 120 is greater than a width-to-length ratio of a driving transistor in the pixel circuit of the sub-pixel in the first display region 110. Further, with respect to the sub-pixels of the same color, the area of the sub-pixel in the second display region 120 is larger than the area of the sub-pixel in the first display region 110, while the distribution density of sub-pixels in the second display region 120 is smaller than the distribution density of sub-pixels in the first display region 110. The driving capability of the pixel circuit is related to the width-to-length ratio of the driving transistor therein. In this regard, if the sub-pixels in the second display region 120 needs to have the same brightness as the sub-pixels in the first display region 110, the driving transistor of the pixel circuit corresponding to the sub-pixel in the second display region 120 should have a greater width-to-length ratio, thereby ensuring brightness uniformity of the sub-pixels in the two display regions.

Figure 4:
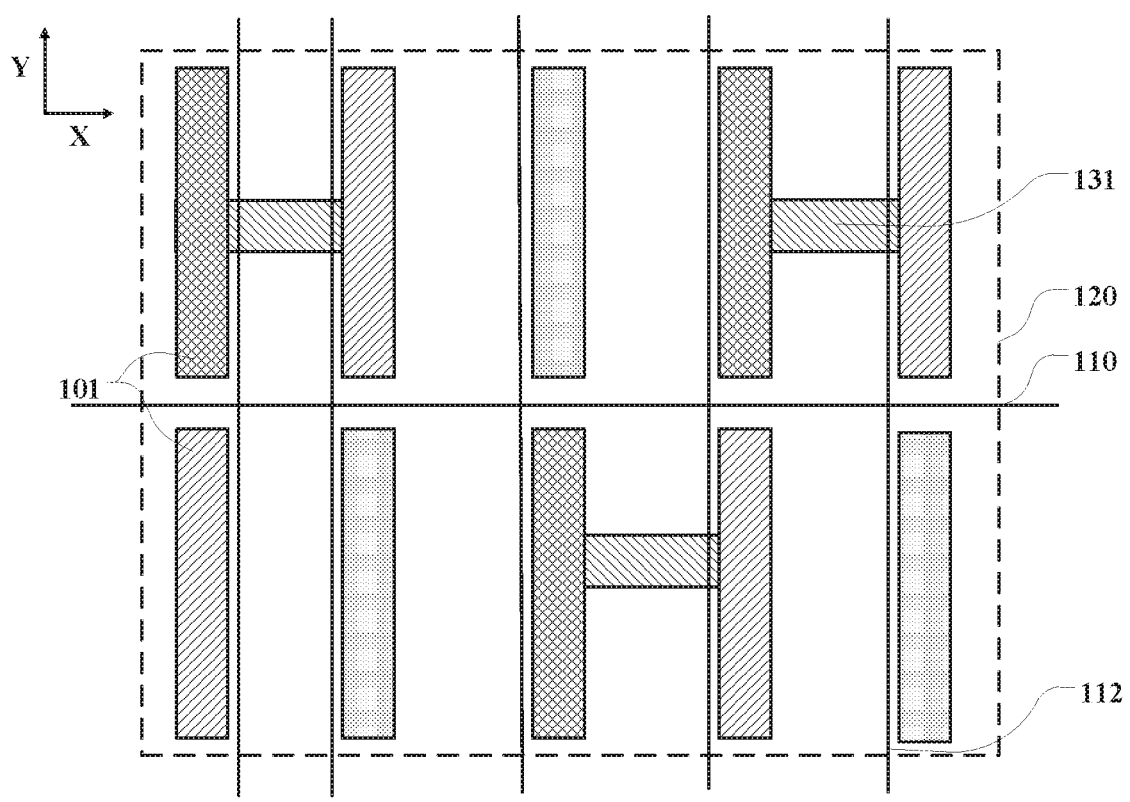
FIG. 4 is a partial schematic diagram of a second display region according to an embodiment of the present disclosure.

FIG. 4 is a partial schematic diagram of the second display region according to an embodiment of the present disclosure. Referring to FIG. 4, in the second display region 120, at least two adjacent sub-pixels 101 share one pixel circuit. With such design, the area of the pixel circuit can be further reduced, and the light transmittance of the non-light-emitting region can be further increased.

As described above, the light-emitting area of the sub-pixel 101 in the second display region 120 is larger than the light-emitting area of the sub-pixel 101 in the first display region 110, and in this regard, there are various variations in the specific difference in the light-emitting area between these two, which will be described in detail in the following embodiments.

Figure 5:
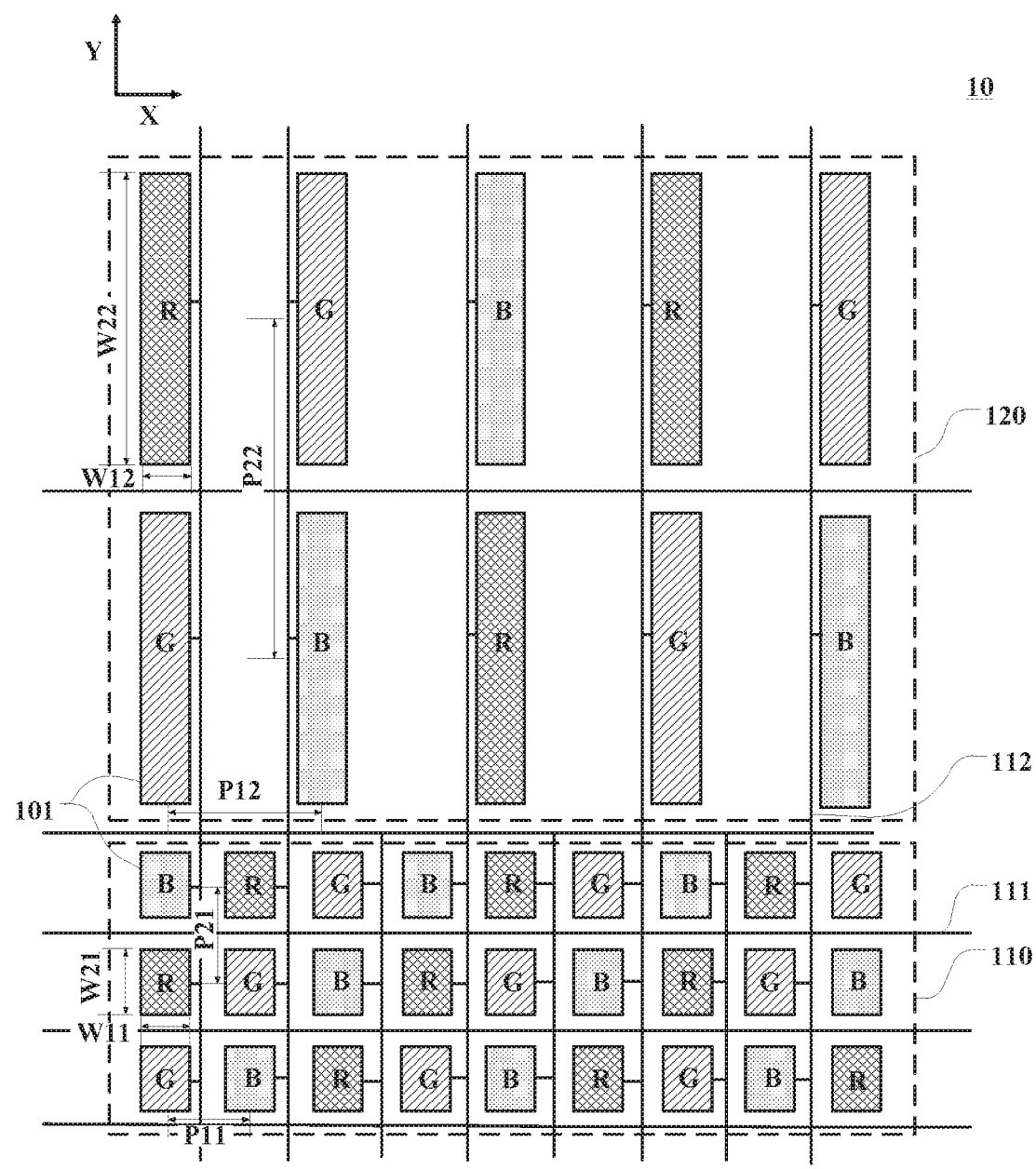
FIG. 5 is a partial schematic diagram of a display panel according to an embodiment of the present disclosure.
Figure 6:
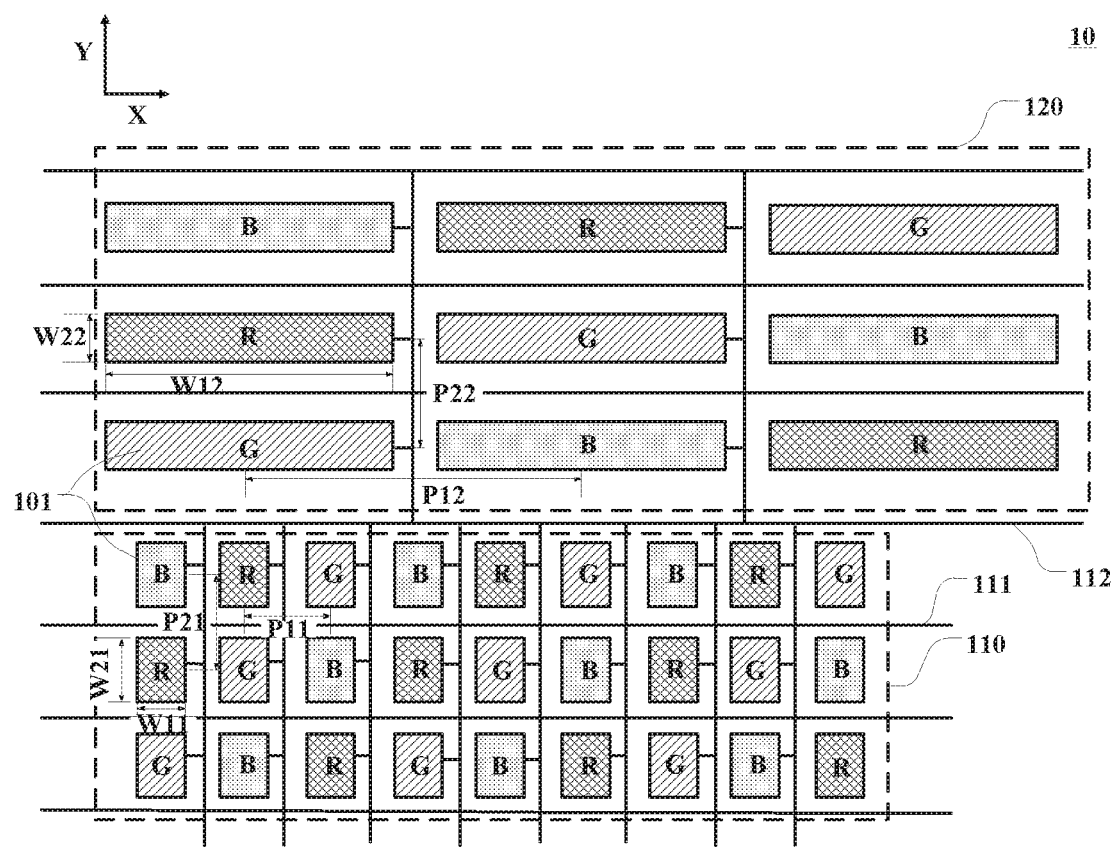
FIG. 6 is a partial schematic diagram of another display panel according to an embodiment of the present disclosure.
Figure 7:
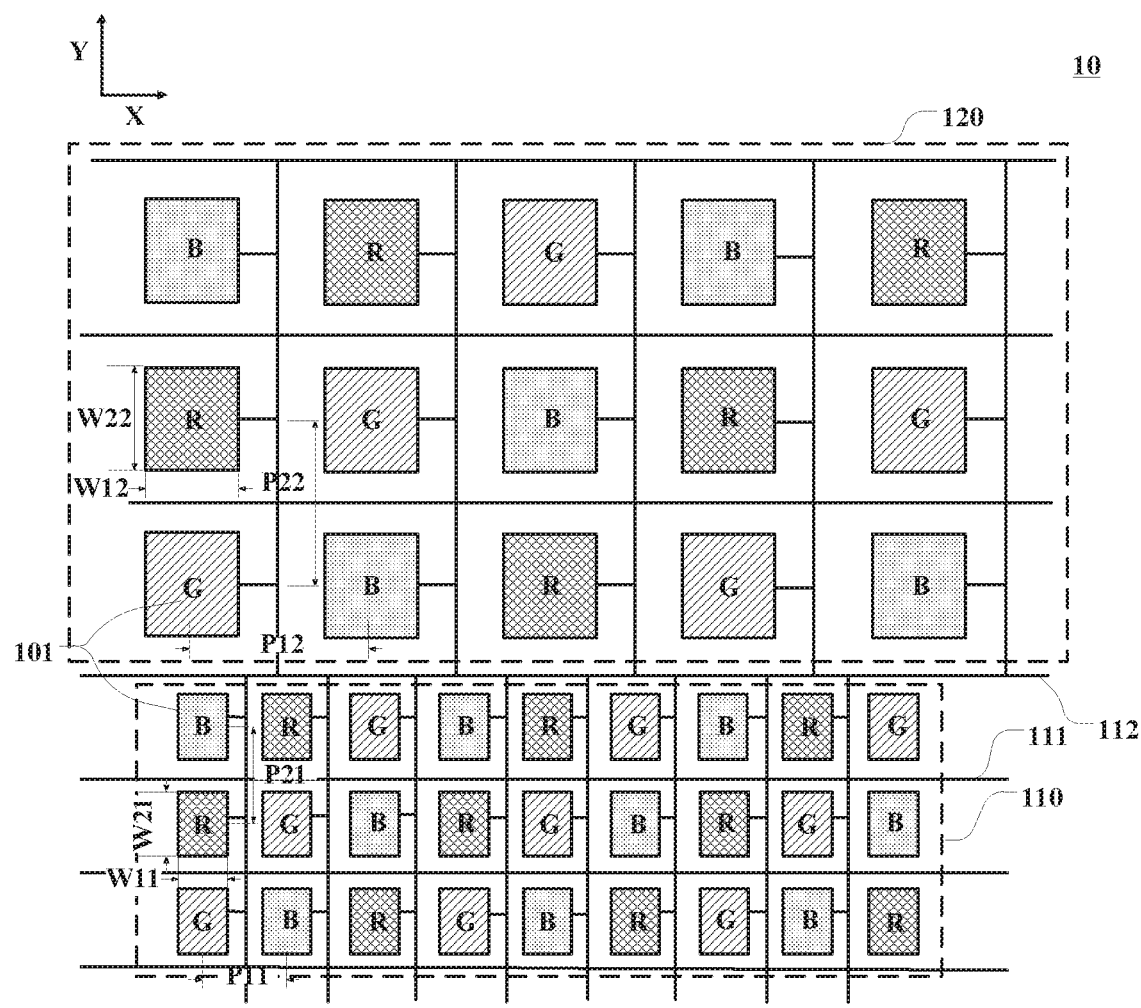
FIG. 7 is a partial schematic diagram of still another display panel according to an embodiment of the present disclosure.

In an embodiment, referring to FIG. 5 to FIG. 7, in the first direction X, a center-to-center distance between two adjacent sub-pixels in the first display region 110 is P11, and a center-to-center distance between two adjacent sub-pixels in the second display region 120 is P12, where P12=R3×P11, and R3≥1.

In the second direction Y, a center-to-center distance between two adjacent sub-pixels in the first display region 110 is P21, and a center-to-center distance between two adjacent sub-pixels in the second display region 120 is P22, where P22=R4×P21, and R4≥1.

FIG. 5 is a partial schematic diagram of a display panel according to an embodiment of the present disclosure. Referring to FIG. 5, among sub-pixels of the same color in the first display region 110 and the second display region 120, a width in the first direction X of the sub-pixel in the first display region 110 is W11, and a width in the first direction X of the sub-pixel in the second display region 120 is W12, where W11 and W12 satisfy: W11=W12; and a width in the second direction Y of the sub-pixel in the first display region is W21 and a width in second direction Y of a sub-pixel in the second display region is W22, where W21 and W22 satisfy: W22=M1×W21, and M1>1. That is, the sub-pixel in the second display region 120 have only a larger dimension in the second direction than the sub-pixel of the same color in the first display region 110. With such design, the data line 112 extending in the second direction Y, when extending from the first display region 110 to the second display region 120, is not required to be winded or bent, thereby simplifying the manufacturing process.

Further, in an embodiment, M1=4, and R3×R4=4.

According to the above-described calculation of the aperture ratio, when M1=4 and R3×R4=4, the aperture ratios of the first display region 110 and the second display region 120 are identical, which ensures the brightness uniformity of the display panel. It should be noted that, in other embodiments, M1 and (R3×R4) can be other values, and the aperture ratios of the first display region 110 and the second display region 120 are identical as long as M1=(R3×R4), thereby ensuring the brightness uniformity of the display panel. In the present embodiment, the center-to-center distance between two adjacent sub-pixels in the first direction X in the second display region 120 is larger, and therefore, the fingerprint recognition or face recognition detecting device can be installed between two adjacent sub-pixels in the first direction X in the second display regions 120.

FIG. 6 is a partial schematic diagram of another display panel according to an embodiment of the present disclosure. Referring to FIG. 6, among sub-pixels having the same color in the first display region 110 and the second display region 120, a width in the first direction X of the sub-pixel in the first display region 110 is W11, and a width in the first direction X of the sub-pixel in the second display region 120 is W12, where W11 and W12 satisfy: W12=N1×W11 and N1>1; and a width in the second direction Y of the sub-pixel in the first display region 110 is W21 and a width in second direction Y of a sub-pixel in the second display region 120 is W22, where W21 and W22 satisfy: W21=W22. In this case, the arrangement of the fingerprint recognition or face recognition detecting device can be specifically matched, and such an arrangement can be selected as needed.

Further, in an embodiment, N1=4, and R3×R4=4.

According to the above-described calculation of the aperture ratio, when N1=4 and R3×R4=4, the aperture ratios of the first display area 110 and the second display area 120 are identical, thereby ensuring brightness uniformity of the display panel. It should be noted that, in other embodiments, N1 and (R3×R4) can be other values, and the aperture ratios of the first display area 110 and the second display area 120 will be identical as long as N1=(R3×R4), thereby ensuring the brightness uniformity of the display panel. In the present embodiment, the center-to-center distance between two adjacent sub-pixels in the second direction Y in the second display area 120 is larger, and therefore, the fingerprint recognition or face recognition detecting device can be installed between two adjacent sub-pixels in the second direction Y in the second display region 120.

FIG. 7 is a partial schematic diagram of still another display panel according to an embodiment of the present disclosure. Referring to FIG. 7, among sub-pixels having a same illumination color in the first display region 110 and the second display region 120, a width in the first direction X of a sub-pixel in the first display region 110 is W11 and a width in the first direction X of a sub-pixel in the second display region 120 is W12, where W11 and W12 satisfy: W12=M2×W11 and M2>1; and a width in the second direction Y of a sub-pixel in the first display region 110 is W21 and a width in second direction Y of a sub-pixel in the second display region 120 is W22, where W21 and W22 satisfy: W21=N2×W22 and N2>1. Under such design, the size of the sub-pixels of the second display area 120 can be freely set, and in practical use, this type of design can also be selected according to the structure of the fingerprint recognition or face recognition device.

Further, in an embodiment, M2=2, N2=2, and R2×R4=4.

According to the above-described calculation manner of the aperture ratio, when M2=2, N2=2, and R3×R4=4, the aperture ratios of the first display area 110 and the second display area 120 are identical, thereby ensuring the brightness uniformity of the display panel.

In addition, it should be noted that the above embodiments are all illustrated by taking a display panel 10 including red sub-pixels (R), green sub-pixels (G), and blue sub-pixels (B) as an example. However, in other alternative embodiments, the display panel 10 may include four or more types of sub-pixels, which is not specifically limited herein.

In addition, it should also be noted that, in the above embodiments, the data lines 112 extend from the first display region 110 to the second display region 120. Since the number of sub-pixels in the second display region 120 is less than that in the first display region 110, only a part of the data lines extends from the first display region 110 to the second display region 120, which causes different loads on different data lines in the display panel. In order to balance the loads, according to an embodiment, a compensation component is connected to a part of the data lines that do not extends to the second display region 120. The compensation component can be a compensation capacitor or a compensation resistor. By providing the compensation component, the loads on the data lines each of which is connected to a relatively small number of sub-pixels can be increased, so that the loads on all the data lines can be balanced, and therefore the brightness of all of the regions of the display panel is uniform.

Figure 8:
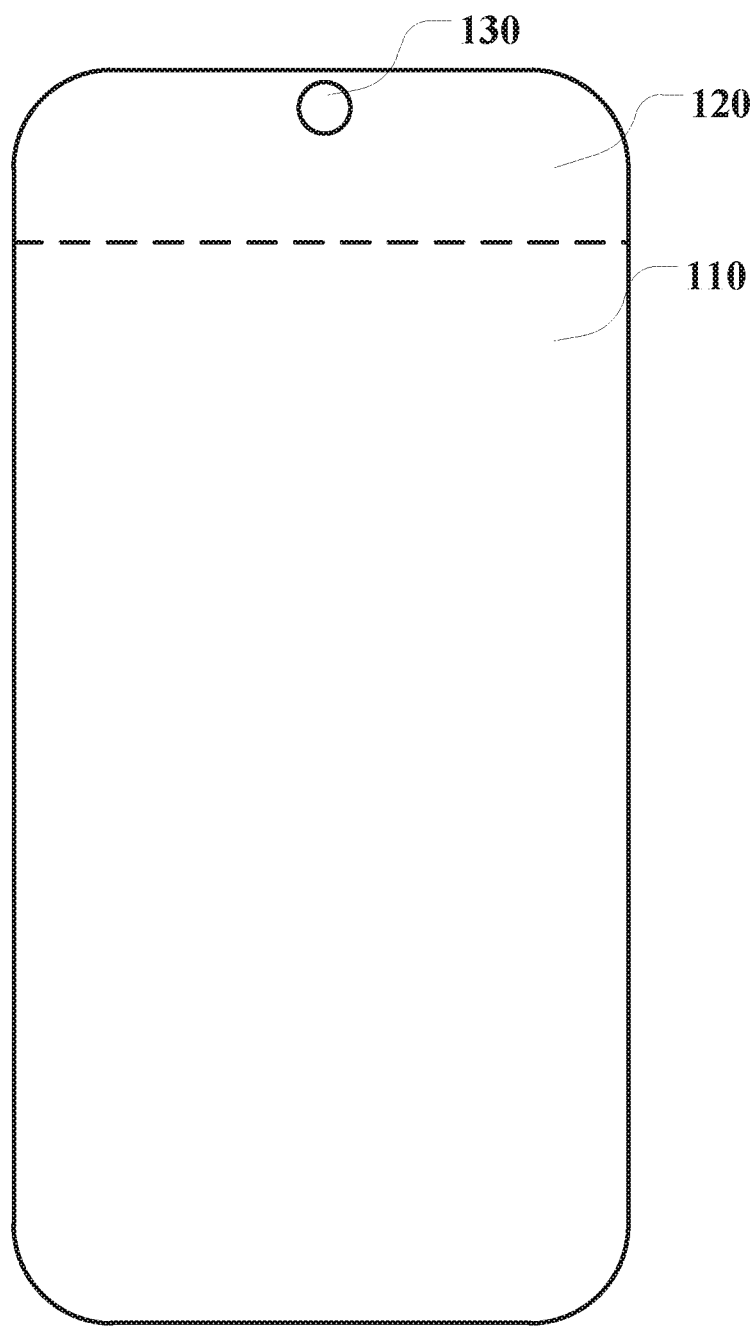
FIG. 8 is a schematic diagram of still another display panel according to an embodiment of the present disclosure.

FIG. 8 is a schematic diagram of a display panel according to an embodiment of the present disclosure. Referring to FIG. 8, a groove or an excavated structure is provided in a non-display region 130 located within the second display region 120. At present, the full display screen is the mainstream trend in the display industry, and the biggest challenge currently encountered in the full display screen is the arrangement of the front camera. Generally, a groove or an excavated structure is provided at an edge of the full screen for arranging the front camera. In the present embodiment, the non-display region 130 is located within the second display region 120, so that the front camera and the face recognition device can be disposed at a specific place of the display screen, and the places of the display screen other than this specific place are used for a normal display, thereby improving the display effect and user experience.

In another aspect of the present disclosure, provided is a display apparatus including the display panel according to any of the above embodiments.

Figure 9:
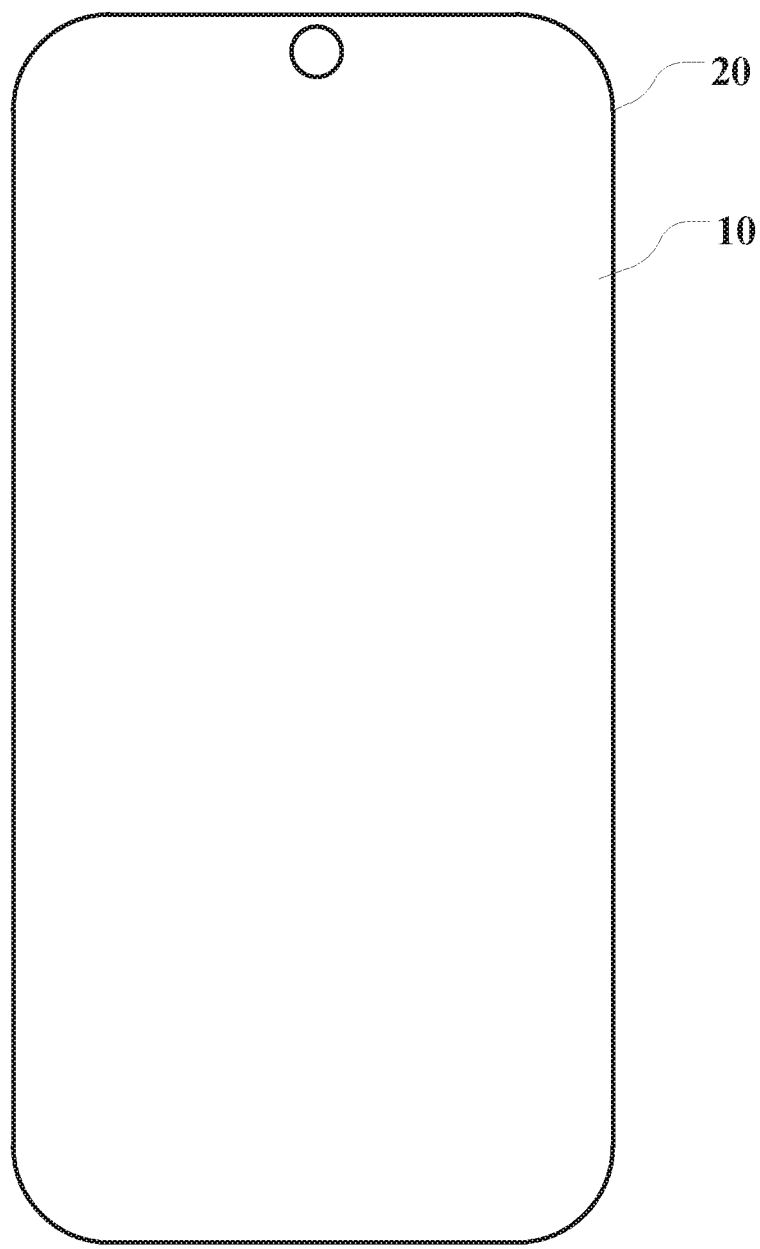
FIG. 9 is a schematic diagram of a display apparatus according to an embodiment of the present disclosure.

FIG. 9 is a schematic diagram of a display apparatus according to an embodiment of the present disclosure. Referring to FIG. 9, the display apparatus 20 includes a display panel 10 described in any of the above embodiments. The display apparatus 20 can be a mobile phone, a notebook computer, a television, a watch, a smart wearable display apparatus, and the like, which is not specifically limited herein. In the present embodiment, a face recognition device is provided in the display apparatus 20 in a region corresponding to the second display region 120, and configured to receive infrared rays through a light-transmitting region of the second display region, so as to recognize a human face and achieve the corresponding unlocking function.

In view of the above description, in the display panel and the display apparatus provided by the present disclosure, the display panel 10 includes a first display region 110 and a second display region 120, the light transmittance of the second display region 120 is greater than that of the first display region 110, the distribution density of the sub-pixels in the second display region 120 is smaller than the distribution density of the sub-pixels in the first display region 110, and among sub-pixels having the same color, the light-emitting area of the sub-pixel in the second display region 120 is larger than the light-emitting area of the sub-pixel in the first display region 110. With such design, on the one hand, the light transmittance in the second display region 120 is increased by reducing the distribution density of the sub-pixels in the second display region 120. On the other hand, since the reduced distribution density of the sub-pixels in the second display region 120 causes a decrease in the aperture ratio of the sub-pixels in the second display region 120, by increasing the light-emitting area of each sub-pixel in the second display region 120, the first display region 110 and the second display region 120 tend to have an identical aperture ratio, thereby ensuring brightness uniformity of the display panel. Since the light transmittance of the second display region 120 is relatively greater, the face recognition device can be disposed at a position corresponding to the position where the light transmittance is greater, so that the face recognition device can sufficiently receive the light signal, so as to accurately realize the unlock function.

The above is a detailed description of the present disclosure in connection with the specific preferred embodiments. However, the embodiments of the present disclosure are not limited to the above description. Those skilled in the art can still make various modifications or replacements without departing from the concept of the present disclosure, and those modifications or replacements shall fall within the protection scope of the present disclosure.

What is claimed is:

1. A display panel having a first display region and a second display region, the display panel comprising
a sub-pixel array comprising a plurality of sub-pixels arranged in an array; and
gate signal lines extending in a first direction and data lines extending in a second direction, the first direction intersecting with the second direction,
wherein the plurality of sub-pixels is distributed in the first display region and the second display region,
wherein a non-light-emitting region in the second display region has a greater light transmittance than a non-light-emitting region in the first display region,
wherein a distribution density of sub-pixels of the plurality of sub-pixels in the second display region is smaller than a distribution density of sub-pixels of the plurality of sub-pixels in the first display region,
wherein among sub-pixels emitting a same color of the plurality of sub-pixels in the first display region and the second display region, a light-emitting area of a sub-pixel in the second display region is larger than a light-emitting area of a sub-pixel in the first display region, and
wherein among the sub-pixels emitting the same color of the plurality of sub-pixels in the first display region and the second display region, a width in the first direction of a sub-pixel in the second display region is R1 times a width in the first direction of a sub-pixel in the first display region, and a width in the second direction of a sub-pixel in the second display region is R2 times a width in the second direction of a sub-pixel in the first display region; and a ratio of a center-to-center distance between two adjacent sub-pixels in the first direction in the second display region to a center-to-center distance between two adjacent sub-pixels in the first direction in the first display region is R3, and a ratio of a center-to-center distance between two adjacent sub-pixels in the second direction in the second display region to a center-to-center distance between two adjacent sub-pixels in the second direction in the first display region is R4, where $0.8 \leq (R1 \times R2)/(R3 \times R4) \leq 1.2$.

2. The display panel according to claim 1, wherein the light transmittance of the non-light-emitting region in the first display region is T1, and the light transmittance of the non-light-emitting region in the second display region is T2, where T1 and T2 satisfy: $3 \leq T2/T1 \leq 50$.

3. The display panel according to claim 1, wherein the plurality of sub-pixels at least comprises red sub-pixels, green sub-pixels, and blue sub-pixels, wherein
a ratio of a light-emitting area of a green sub-pixel in the second display region to a light-emitting area of a green sub-pixel in the first display region is smaller than a ratio of a light-emitting area of a red sub-pixel in the second display region to a light-emitting area of a red sub-pixel in the first display region and/or a ratio of a light-emitting area of a blue sub-pixel in the second display region to a light-emitting area of a blue sub-pixel in the first display region.

4. The display panel according to claim 1, wherein each of the plurality of sub-pixels comprises an anode and a pixel circuit, wherein
for each of the plurality of sub-pixels in the second display region, the anode and the pixel circuit extend along a same direction, and in a direction perpendicular to a plane of the display panel, the anode and the pixel circuit overlap each other.

5. The display panel according to claim 4, wherein for each of the plurality of sub-pixels in the second display region, the anode completely covers the pixel circuit in at least one direction of the first direction or the second direction.

6. The display panel according to claim 4, wherein among the sub-pixels emitting the same color of the plurality of sub-pixels in the first display region and the second display region, a width-to-length ratio of a driving transistor in the pixel circuit of a sub-pixel in the second display region is greater than a width-to-length ratio of a driving transistor in the pixel circuit of a sub-pixel in the first display region.

7. The display panel according to claim 4, wherein at least two adjacent sub-pixels of the plurality of sub-pixels distributed in the second display region share one pixel circuit.

8. The display panel according to claim 1, wherein a center-to-center distance between two adjacent sub-pixels in the first direction in the first display region is P11, and a center-to-center distance between two adjacent sub-pixels in the first direction in the second display region is P12, where P11 and P12 satisfy: $P12=R3 \times P11$, and $R3 \geq 1$; and
a center-to-center distance between two adjacent sub-pixels in the second direction in the first display region is P21, and a center-to-center distance between two adjacent sub-pixels in the second direction in the second display region is P22, where P21 and P22 satisfy: $P22=R4 \times P21$, and $R4 \geq 1$.

9. The display panel according to claim 8, wherein among the sub-pixels emitting the same color of the plurality of sub-pixels in the first display region and the second display region, a width in the first direction of a sub-pixel in the first display region is W11, and a width in the first direction of a sub-pixel in the second display region is W12, where W11 and W12 satisfy: $W11=W12$; and
a width in the second direction of a sub-pixel in the first display region is W21 and a width in second direction of a sub-pixel in the second display region is W22, where W21 and W22 satisfy: $W22=M1 \times W21$, and $M1>1$.

10. The display panel according to claim 9, wherein $M1=4$ and $R3 \times R4=4$.

11. The display panel according to claim 8, wherein among the sub-pixels emitting the same color of the plurality of sub-pixels in the first display region and the second display region, a width in the first direction of a sub-pixel in the first display region is W11, and a width in the first direction of a sub-pixel in the second display region is W12, where W11 and W12 satisfy: W12=N1×W11 and N1>1; and a width in the second direction of a sub-pixel in the first display region is W21 and a width in second direction of a sub-pixel in the second display region is W22, where W21 and W22 satisfy: W21=W22.

12. The display panel according to claim 11, wherein N1=4 and R3×R4=4.

13. The display panel according to claim 8, wherein among the sub-pixels emitting the same color of the plurality of sub-pixels in the first display region and the second display region, a width in the first direction of a sub-pixel in the first display region is W11, and a width in the first direction of a sub-pixel in the second display region is W12, where W11 and W12 satisfy: W12=M2×W11, and M2>1; and a width in the second direction of a sub-pixel in the first display region is W21, and a width in second direction of a sub-pixel in the second display region is W22, where W21 and W22 satisfy: W21=N2×W22, and N2>1.

14. The display panel according to claim 13, wherein M2=2, N2=2, and R3×R4=4.

15. The display panel according to claim 1, wherein a grooved or an excavated structure is provided in a non-display region located within the second display region.

16. A display apparatus, comprising the display panel according to claim 1.

17. The display apparatus according to claim 16, further comprising a face recognition device disposed in the second display region, and the face recognition device is configured to receive infrared rays through a light-transmitting region of the second display region to recognize a human face.

18. A display panel having a first display region and a second display region, the display panel comprising:

a sub-pixel array comprising a plurality of sub-pixels arranged in an array; and gate signal lines extending in a first direction and data lines extending in a second direction, the first direction intersecting with the second direction, wherein the plurality of sub-pixels is distributed in the first display region and the second display region, wherein a non-light-emitting region in the second display region has a greater light transmittance than a non-light-emitting region in the first display region, wherein a distribution density of sub-pixels of the plurality of sub-pixels in the second display region is smaller than a distribution density of sub-pixels of the plurality of sub-pixels in the first display region, wherein among sub-pixels emitting a same color of the plurality of sub-pixels in the first display region and the second display region, a light-emitting area of a sub-pixel in the second display region is larger than a light-emitting area of a sub-pixel in the first display region, and wherein the plurality of sub-pixels at least comprises red sub-pixels, green sub-pixels, and blue sub-pixels, wherein a ratio of a light-emitting area of a green sub-pixel in the second display region to a light-emitting area of a green sub-pixel in the first display region is smaller than a ratio of a light-emitting area of a red sub-pixel in the second display region to a light-emitting area of a red sub-pixel in the first display region and/or a ratio of a light-emitting area of a blue sub-pixel in the second display region to a light-emitting area of a blue sub-pixel in the first display region.

* * * * *